US008692111B2

(12) United States Patent
Kim et al.

(10) Patent No.: US 8,692,111 B2
(45) Date of Patent: Apr. 8, 2014

(54) HIGH THROUGHPUT LASER ABLATION PROCESSES AND STRUCTURES FOR FORMING CONTACT HOLES IN SOLAR CELLS

(75) Inventors: Taeseok Kim, Pleasanton, CA (US); Gabriel Harley, Mountain View, CA (US); David D. Smith, Campbell, CA (US); Peter John Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 51 days.

(21) Appl. No.: 13/298,136

(22) Filed: Nov. 16, 2011

(65) Prior Publication Data

US 2013/0048067 A1    Feb. 28, 2013

Related U.S. Application Data

(60) Provisional application No. 61/526,530, filed on Aug. 23, 2011.

(51) Int. Cl.
*H01L 21/00* (2006.01)
*H01L 31/00* (2006.01)

(52) U.S. Cl.
USPC ............................................ 136/256; 438/98

(58) Field of Classification Search
USPC ........................................................ 136/256
See application file for complete search history.

(56) References Cited

U.S. PATENT DOCUMENTS

| | | | |
|---|---|---|---|
| 4,322,571 A | 3/1982 | Stanbery | |
| 5,432,015 A | 7/1995 | Wu et al. | |
| 5,738,731 A | 4/1998 | Shindo et al. | |
| 5,821,590 A | 10/1998 | Lee et al. | |
| 7,651,900 B2 | 1/2010 | Kim | |
| 7,732,104 B2 | 6/2010 | Wagner | |
| 7,732,264 B2 | 6/2010 | Shih | |
| 7,759,607 B2 | 7/2010 | Chism, II | |
| 7,777,154 B2 | 8/2010 | Satoh et al. | |
| 7,781,766 B2 | 8/2010 | Shih et al. | |
| 7,799,659 B2 | 9/2010 | Pressel et al. | |
| 8,129,822 B2 | 3/2012 | Moslehi | |
| 2003/0221718 A1 | 12/2003 | Kubo et al. | |

(Continued)

OTHER PUBLICATIONS

PCT International Search Report & Written Opinion for Application No. PCT/US2012/050950, Oct. 22, 2012, 8 sheets.

(Continued)

*Primary Examiner* — Alicia Bland
*Assistant Examiner* — Dujuan Horton
(74) *Attorney, Agent, or Firm* — Okamoto & Benedictor LLP

(57) ABSTRACT

Contact holes of solar cells are formed by laser ablation to accommodate various solar cell designs. Throughput of the solar cell ablation process is improved by incorporating linear base diffusion regions with narrow width, for example as compared to an overlying metal contact. Throughput of the solar cell ablation process may also be improved by having contact holes to base diffusion regions that are perpendicular to contact holes to emitter diffusion regions. To allow for continuous laser scanning, a laser blocking layer may be located over an interlayer dielectric to prevent contact hole formation on certain regions, such as regions where a metal contact of one polarity may electrically shunt to a diffusion region of opposite polarity. In a hybrid design, a solar cell may have both linear and dotted base diffusion regions. An electro-optical modulator may be employed to allow for continuous laser scanning in dotted base diffusion designs.

17 Claims, 18 Drawing Sheets

(56) References Cited

U.S. PATENT DOCUMENTS

| | | | |
|---|---|---|---|
| 2004/0061543 A1* | 4/2004 | Nam et al. | 327/342 |
| 2006/0060238 A1 | 3/2006 | Hacke et al. | |
| 2006/0130891 A1* | 6/2006 | Carlson | 136/256 |
| 2006/0196535 A1* | 9/2006 | Swanson et al. | 136/244 |
| 2008/0017243 A1 | 1/2008 | De Ceuster et al. | |
| 2008/0035198 A1 | 2/2008 | Teppe et al. | |
| 2008/0157283 A1 | 7/2008 | Moslehi | |
| 2008/0299297 A1 | 12/2008 | Cousins et al. | |
| 2009/0107545 A1 | 4/2009 | Moslehi | |
| 2009/0151784 A1 | 6/2009 | Luan et al. | |
| 2009/0188553 A1 | 7/2009 | Dubin | |
| 2009/0239331 A1* | 9/2009 | Xu et al. | 438/98 |
| 2009/0308457 A1 | 12/2009 | Smith | |
| 2010/0186808 A1 | 7/2010 | Borden | |
| 2010/0304522 A1 | 12/2010 | Rana et al. | |
| 2011/0023956 A1* | 2/2011 | Harder | 136/256 |
| 2011/0041908 A1 | 2/2011 | Harder | |
| 2011/0126898 A1 | 6/2011 | Harley et al. | |
| 2011/0139241 A1 | 6/2011 | Clement et al. | |
| 2012/0028399 A1 | 2/2012 | Moslehi et al. | |
| 2012/0055546 A1 | 3/2012 | Turner | |
| 2012/0060908 A1 | 3/2012 | Crafts | |

OTHER PUBLICATIONS

Unitek Miyachi Lasers Connections, "Understanding Laser Parameters for Weld Development" Technical Application Brief, 2003, 2 sheets, vol. 1/No. 3.

Overview: Lumera Laser Products, Jan. 2009, pp. 1-12.

* cited by examiner

HIGH THROUGHPUT LASER ABLATION PROCESSES AND STRUCTURES FOR FORMING CONTACT HOLES IN SOLAR CELLS

REFERENCES TO RELATED APPLICATION

This application claims the benefit of U.S. Provisional Application No. 61/526,530, filed on Aug. 23, 2011, which is incorporated herein by reference in its entirety.

TECHNICAL FIELD

Embodiments of the subject matter described herein relate generally to solar cells. More particularly, embodiments of the subject matter relate to solar cell fabrication processes and structures.

BACKGROUND

Solar cells are well known devices for converting solar radiation to electrical energy. They may be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact, backside junction (BCBJ) solar cell, the P-type and N-type diffusion regions and the metal contacts coupled to them are on the backside of the solar cell. The metal contacts allow an external electrical circuit to be coupled to and be powered by the solar cell.

In high-efficiency solar cells, cell parameters, such as shunt resistance, series resistance, and bulk lifetime are important parameters to maintain on the final fabricated devices. Solar cell process steps, in particular laser ablation steps on BCBJ solar cells, may impact each of these parameters. Post laser losses due to series resistance or lifetime maybe be offset at the expense of step cost, such as by adding thermal or etching steps. As is described within, an added complication of shunting on high-efficiency BCBJ solar cells may be prevalent when the cell architecture has metal of one polarity over diffusions of another polarity.

To compete with other energy sources available on the market, solar cells not only have to be efficient but also fabricated at relatively low cost and high yield. Embodiments of the present invention pertain to novel solar cell fabrication processes and structures that reduce the cost of solar cell fabrication and improve solar cell reliability.

BRIEF SUMMARY

In one embodiment, a process of fabricating a solar cell includes forming a plurality of strips of linear base diffusion regions, the plurality of strips of linear base diffusion regions being configured to collect majority charge carriers in the solar cell. An interlayer dielectric is formed over the plurality of linear base diffusion regions and over linear emitter diffusion regions. Laser is used to form a plurality of contact holes through the interlayer dielectric to expose a strip of linear base diffusion region in the plurality of strips of linear base diffusion regions. A metal contact is formed over the strip of linear base diffusion region, the metal contact being electrically coupled to the strip of linear base diffusion region through contact holes in the plurality of contact holes.

In another embodiment, a solar cell comprises a plurality of strips of linear base diffusion regions, an interlayer dielectric over the plurality of strips of linear base diffusion regions, a plurality of laser-drilled contact holes through the interlayer dielectric, the plurality of laser-drilled contact holes exposing a strip of linear base diffusion region in the plurality of strips of linear base diffusion regions, each of the plurality of laser-drilled contact holes having a diameter of at most 40 microns, and a metal contact electrically coupled to the strip of the linear base diffusion region through laser-drilled contact holes in the plurality of laser-drilled contact holes.

A process for fabricating a solar cell includes forming a linear base diffusion region, the linear base diffusion region being configured to collect majority charge carriers in the solar cell. An interlayer dielectric is formed over the linear base diffusion region. Laser is used to form a plurality of laser-drilled contact holes through the interlayer dielectric to expose the linear base diffusion region. A metal contact is formed over the strip of linear base diffusion region, the metal contact being electrically coupled to the linear base diffusion region through laser-drilled contact holes in the plurality of laser-drilled contact holes.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter disclosed herein may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of apparatus, processes, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

In some high-efficiency solar cell designs, metal contacts for one polarity of diffusion region may run over an opposite polarity diffusion region (e.g., metal contact for an N-type diffusion region formed over a P-type diffusion region). In that solar cell design, it is critical that the interlayer dielectric that electrically insulates the metal contacts from the diffusion regions is free of defects. Otherwise, a metal contact of one polarity may electrically short to a diffusion region of opposite polarity through a defect in the interlayer dielectric.

Figure 1:
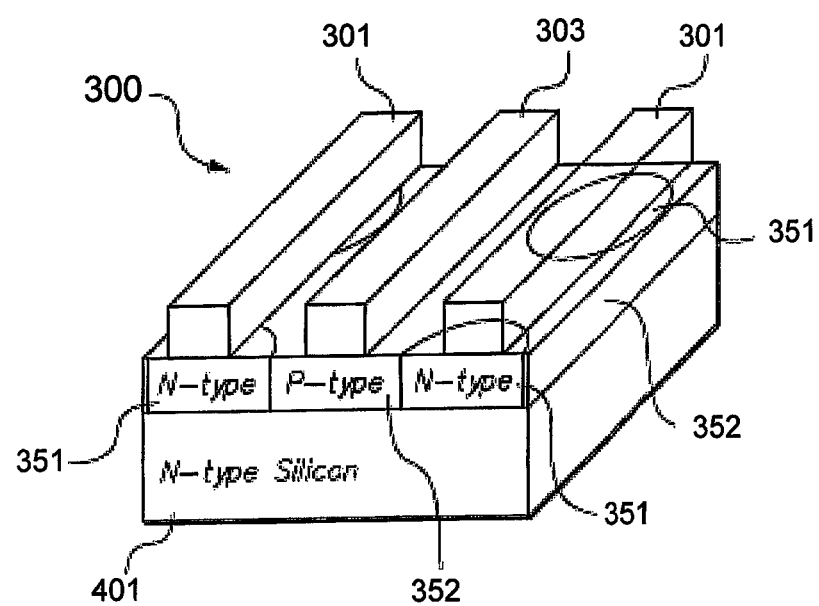
FIG. 1 schematically shows an example BCBJ solar cell with metal contacts that are formed over opposite polarity diffusion regions.

FIG. 1 schematically shows an example backside contact, backside junction (BCBJ) solar cell 300 with metal contacts that are formed over opposite polarity diffusion regions. In the example of FIG. 1, the P-type (labeled 352) and N-type (labeled 351) diffusion regions are formed in a substrate 401 (e.g., mono-crystalline or multi-crystalline silicon). In other embodiments, the P-type and N-type diffusion regions are formed in another layer, e.g., polysilicon, on a backside surface of the substrate of 401. Interlayer dielectrics are not shown in FIG. 1 for clarity of illustration.

The solar cell 300 includes metal contacts 301 and 303. Metal contacts 301 are N-polarity metal contacts in that they electrically couple to corresponding N-type diffusion regions. Similarly, metal contacts 303 (only one is shown in FIG. 1) are P-polarity metal contacts that electrically couple to corresponding P-type diffusion regions. The metal contacts 301 and 303 may be interdigitated. One metal contact 301 is depicted in FIG. 1 as a transparent line tracing to more clearly show underlying N-type diffusion regions. As shown in FIG. 1, an N-polarity metal contact 301 passes over portions of a P-type diffusion region. This creates the possibility of the N-polarity metal contact 301 being electrically shorted to the P-type diffusion region through an intervening interlayer dielectric (not shown in FIG. 1; see 305 in FIGS. 3 and 8).

Figure 2:
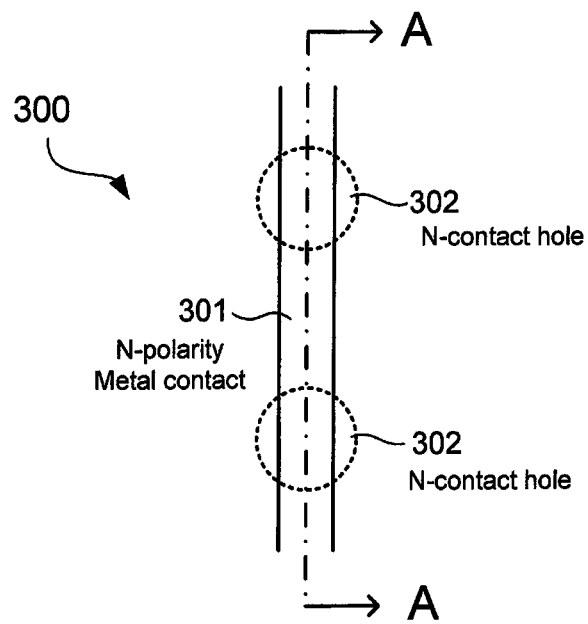
FIG. 2 shows a top view of the solar cell of FIG. 1.

FIG. 2 shows a top view of a portion of the solar cell 300. The solar cell 300 includes contact holes 302 that are formed through an interlayer dielectric separating the N-polarity metal contact 301 from underlying diffusion regions. The N-polarity metal contact 301 contacts underlying N-type diffusion regions through corresponding contact holes 302.

Figure 3:
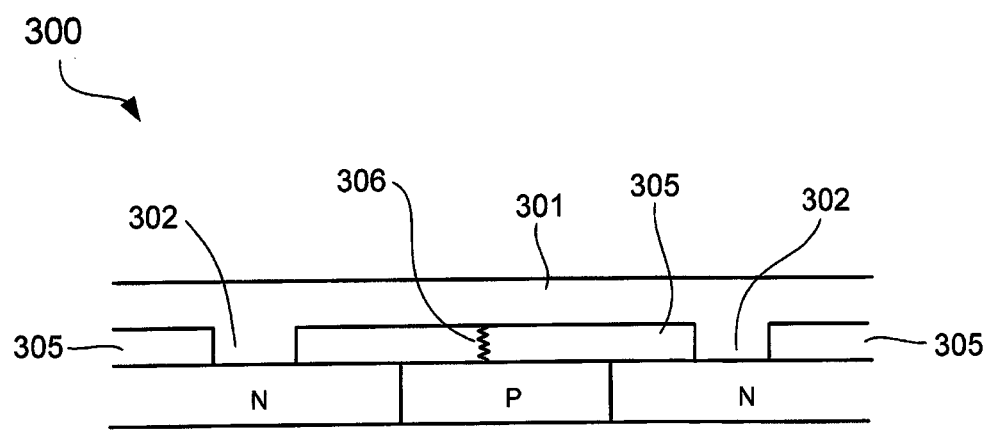
FIG. 3 shows a cross-section of the solar cell of FIG. 1 taken at section A-A of FIG. 2.

FIG. 3 shows a cross-section of the solar cell 300 taken at section A-A of FIG. 2. As shown in FIG. 3, the solar cell 300 includes an interlayer dielectric 305, which electrically insulates the N-polarity metal contact 301 from underlying diffusion regions. Contact holes 302 are formed through the interlayer dielectric 305 to allow the N-polarity metal contact 301 to electrically connect to corresponding N-type diffusion regions. The contact holes 302 are typically formed by conventional masking and wet etching. The inventors discovered that some etchants used in the etch process may worsen existing imperfections (e.g., pinholes, pits, and other defects) in the interlayer dielectric 305, turning the imperfections into full-blown defects. For example, some etchants may enlarge existing pinholes. As another example, some etchants may result in creation of an electrical short 306 through the interlayer dialect 305.

Using a laser, rather than a conventional wet etch process, to form the contact holes 302 advantageously avoids worsening imperfections that may be present in the interlayer dielectric 305. By avoiding exposure of the interlayer dielectric 305 to harmful etchants during contact hole formation, a laser ablation step preserves the integrity of the interlayer dielectric 305.

Figure 4:
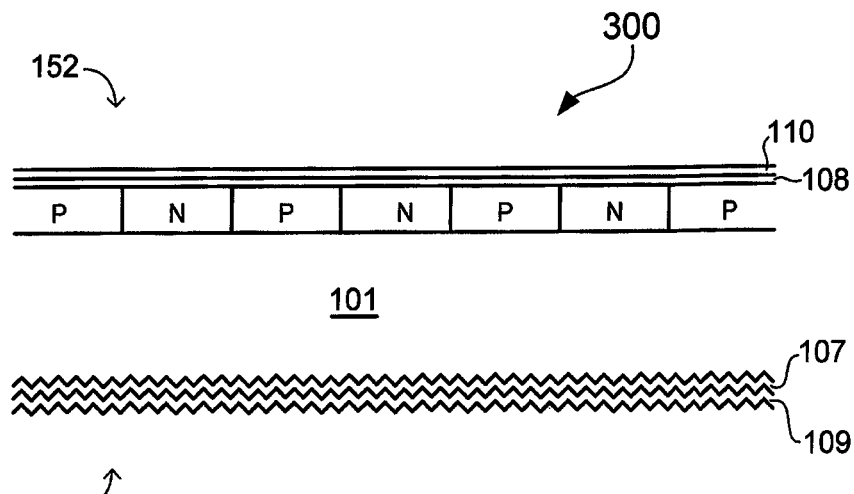
FIGS. 4-6 show cross-sections of a solar cell being fabricated in accordance with an embodiment of the present invention.

FIG. 4 shows a cross-section of a solar cell 300 being fabricated in accordance with an embodiment of the present invention. The solar cell 300 has a front side 153 and a backside 152. The front side 153 faces the sun to collect solar radiation during normal operation. The backside 152 is opposite the front side 153.

In the example of FIG. 4, the substrate 101 comprises an N-type monocrystalline silicon wafer. The P-type and N-type diffusion regions are formed in the solar cell substrate 101, but may also be in another layer (e.g., polysilicon) formed on the solar cell substrate 101. The front side surface of the substrate 101 is textured with random pyramids to increase solar radiation collection efficiency. A passivation region 107 passivates the front side surface of the substrate 101 to minimize recombination. In one embodiment, the passivation region 107 is an N-type passivation region formed by diffusing N-type dopants from the front side 153. The N-type dopants may comprise phosphorus. In one embodiment, the passivation region 107 is formed by heating the substrate 101 in a furnace where phosphorus is introduced. The phosphorus diffuses into the front side of the substrate 101 to form the passivation region 107. A silicon dioxide layer 108 on the back side 152 of the solar cell is a byproduct of forming the passivation region 107. More specifically, the heating step to diffuse N-type dopants into the substrate 101 and form the passivation region 107 also results in growth of the oxide layer 108 on the backside surface of the substrate 101.

An anti-reflective coating 109 is formed on the front side 153 and an anti-reflective coating 110 is formed on the backside 152. In one embodiment, the anti-reflective coatings 109 and 110 comprise silicon nitride. On the front side 153, the anti-reflective coating 109 is formed on the passivation region 107 on the front side surface of the substrate 101. On the backside 152, the anti-reflective coating 110 is formed on the oxide layer 108.

Figure 5:
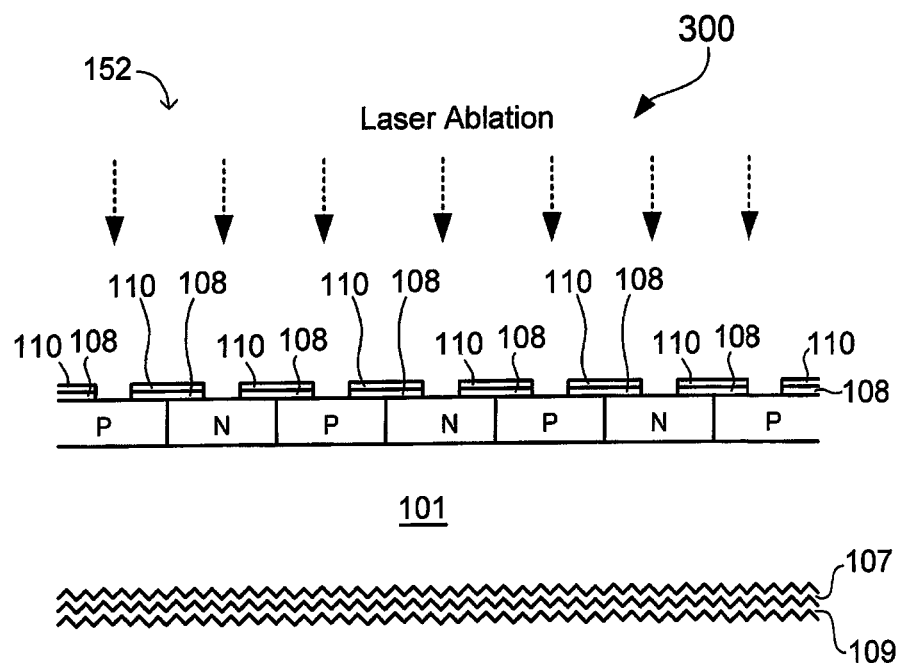

In FIG. 5, a laser ablation step is performed on the solar cell 300 to form contact holes to the P-type and N-type diffusion regions. The laser ablation step may involve firing one or more laser beams to remove materials from the backside 152 and thereby expose the P-type and N-type diffusion regions for metallization. In the example of FIG. 5, the laser ablation step removes portions of the anti-reflective coating 110 and oxide layer 108 to form contact holes to the P-type and N-type diffusion regions. The laser ablation step may be performed by firing laser beams through a laser scanner, which scans the laser beams on the backside 152 to form the contact holes. A commercially available laser source and scanner may be employed to perform the laser ablation. An example solar cell ablation system that employs a laser is disclosed in commonly-owned U.S. application Ser. No. 12/829,275, filed on Jul. 1, 2010. Other ablation systems that employ a laser may also be employed.

The use of a laser to form the contact holes to the P-type and N-type diffusion regions advantageously eliminates masking and curing steps that may be necessary in other processes where the contact holes are formed by a traditional etch process. In addition, laser ablation prevents exposure of the anti-reflective coating 110 and oxide layer 108, and any interlayer dielectric that may be present, to etchants that may worsen existing defects or imperfections.

Figure 6:
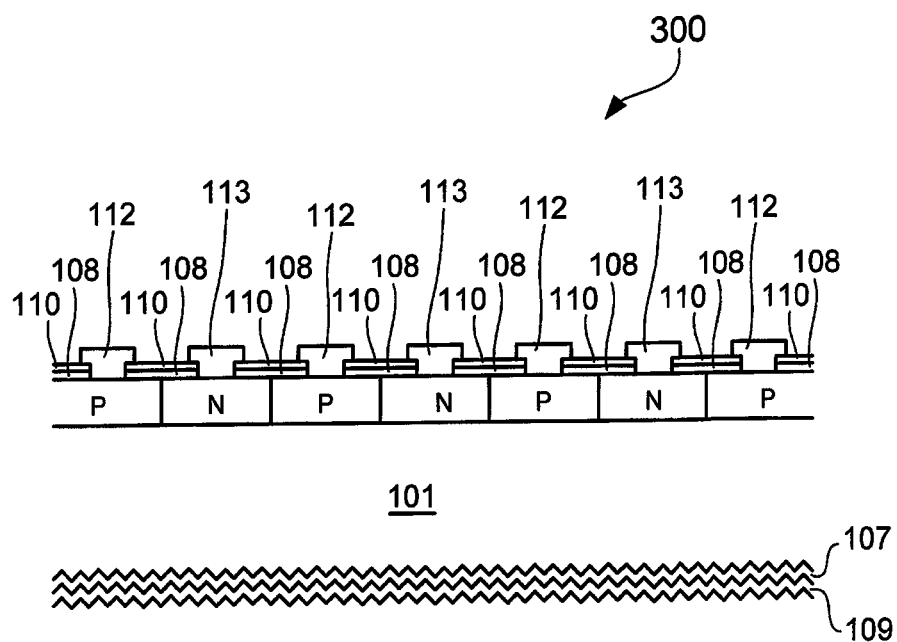

In FIG. 6, metal contacts 112 and 113 are formed in the contact holes to make electrical connection to corresponding diffusion regions. In the example of FIG. 6, the metal contacts 112 are formed in contact holes to make electrical connection to the P-type diffusion regions. Similarly, the metal contacts 113 are formed in contact holes to make electrical connection to the N-type diffusion regions. The metal contacts 112 and 113 may be interdigitated, and may comprise copper or other single layer or multi-layer electrically conductive materials employed for metallization. The metal contacts 112 and 113 may be formed by electro-plating, for example. The metal contacts 112 and 113 allow an electrical circuit to be coupled to and be powered by the solar cell. A metal contact 112 to a P-type diffusion region may pass over an N-type diffusion region. Similarly, a metal contact 113 to an N-type diffusion region may pass over a P-type diffusion region. Because the metal contacts are formed in contact holes formed by laser ablation, the chances of a metal contact electrically shorting to an opposite polarity diffusion region is greatly diminished.

Figure 7:
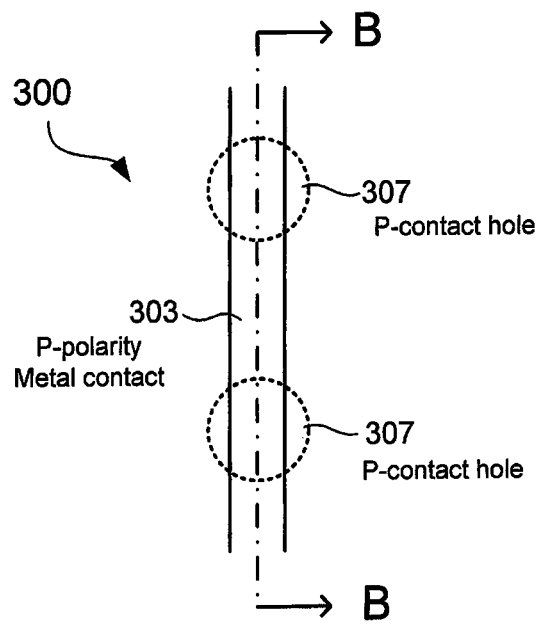
FIG. 7 shows another top view of the solar cell of FIG. 1.

A potential laser-related problem discovered by the inventors is now described with reference to FIGS. 7 and 8. FIG. 7 shows another top view of a portion of the solar cell 300 of FIG. 1. The solar cell 300 includes contact holes 307 that are formed through an interlayer dielectric separating the P-polarity metal contact 303 from underlying diffusion regions.

Figure 8:
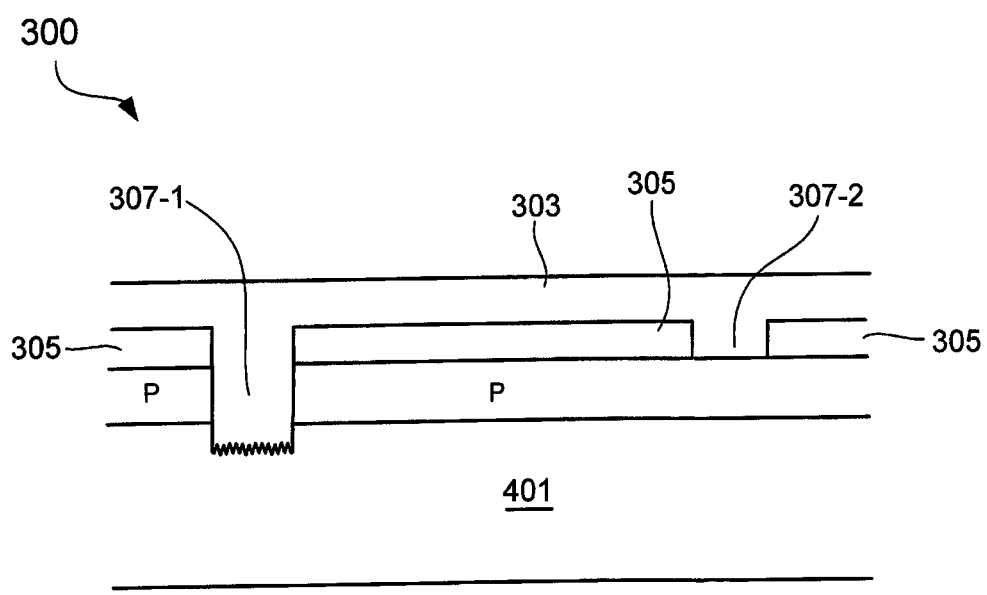
FIG. 8 shows a cross-section of the solar cell of FIG. 1 taken at section B-B of FIG. 7.

FIG. 8 shows a cross-section of the solar cell 300 taken at section B-B of FIG. 7. Contact holes 307 (i.e., 307-1, 307-2, . . . ) are formed through the interlayer dielectric 305 to allow the P-polarity metal contact 303 to electrically connect to the underlying P-type diffusion region.

In the example of FIG. 8, the contact holes 307 are formed by laser ablation. If the laser is not properly controlled, the laser beam may punch through the diffusion region, thereby adversely affecting the operation of the solar cell by electrically shorting the subsequently formed metal contact to the substrate. In the example of FIG. 8, the laser ablation step formed the contact hole 307-1 all the way through the interlayer dielectric 305, all the way through the P-type diffusion region, and into the substrate 401. One way of addressing this laser punch through problem is to make the diffusion regions deeper, as now explained with reference to FIG. 9.

Figure 9:
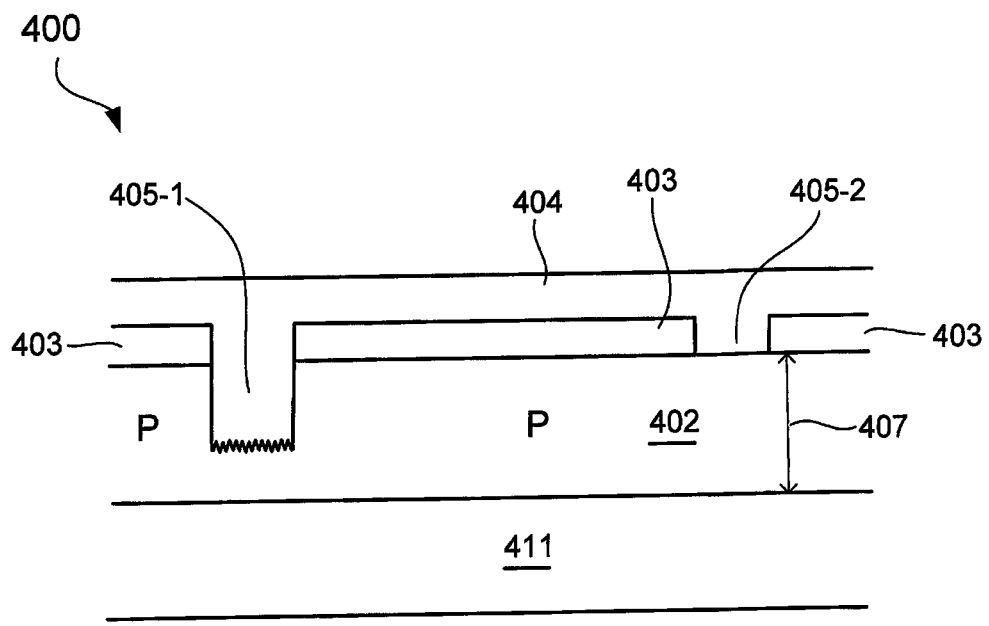
FIG. 9 shows a cross-section of a solar cell with deep diffusion regions in accordance with an embodiment of the present invention.

FIG. 9 shows a cross-section of a solar cell 400 with deep diffusions in accordance with an embodiment of the present invention. In the example of FIG. 9, a P-type diffusion region (labeled as 402) is formed in a solar cell substrate 411, which comprises a monocrystalline silicon wafer. In other embodiments, the P-type diffusion region is formed in another layer (e.g., polysilicon) formed on the backside surface of the substrate 411. In the example of FIG. 9, contact holes 405 (i.e., 405-1, 405-2, . . . ) are formed through an interlayer dielectric 403 by laser ablation. A P-polarity metal contact 404 electrically connects to the P-type diffusion region through the contact holes 405. It is to be noted that all figures in this disclosure, including FIG. 9, are not drawn to scale.

In the example of FIG. 9, the P-type diffusion region is formed to be relatively deep. For example, the P-type diffusion region may have a depth 407 deeper than 0.5 µm. The depth of the P-type diffusion region is dictated by the process margins of the laser ablation step. Preferably, the required laser ablation depth is minimized for the process, and then measured on a cross-section. The dopant depth of the diffusion region is then set deeper than the required laser ablation depth by controlling the dopant formation process (e.g., furnace temperature and time, starting dopant concentration, etc). Deep diffusion regions advantageously allow for a laser ablation step with wider process margins. Deep N-type diffusion regions formed on the backside of the solar cell with the P-type diffusions region may also have the same depth as the P-type diffusion regions.

In the example of FIG. 9, the contact hole 405-1 is formed relatively deep into the P-type diffusion region. The deep contact hole 405-1 may be due to problems related to process control in general, laser ablation process margin, or other issues. However, unlike in FIG. 8, the contact hole 405-1 does not punch all the way through the P-type diffusion region because of the depth of the P-type diffusion region. The metal contact 404 is formed in the contact holes 405 (i.e., 405-1, 405-2, . . . ). The metal contact 404 may safely pass over a diffusion region of opposite polarity (i.e., N-type diffusion region) because the metal contact 404 is formed in contact holes formed by laser ablation.

The inventors also discovered that different film thicknesses found in some solar cell designs may complicate laser ablation. An example of such solar cell design is shown in FIG. 10.

Figure 10:
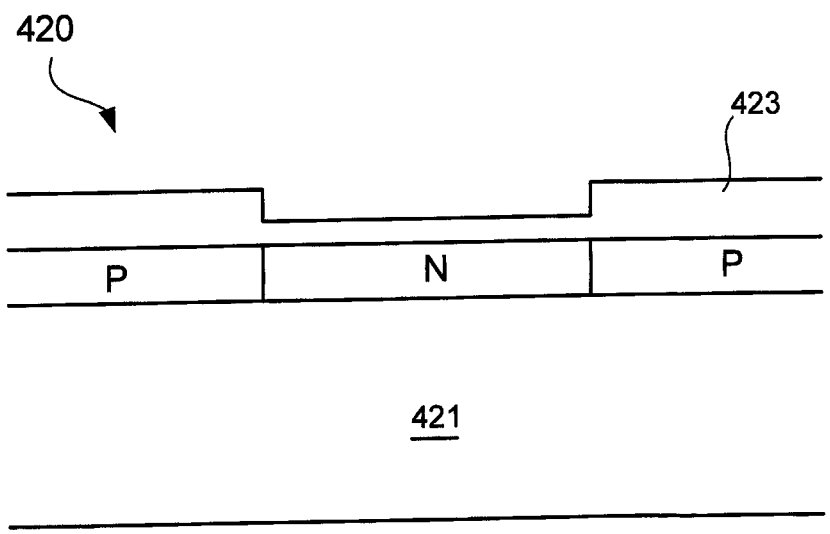
FIGS. 10-13 show cross-sections of a solar cell being fabricated in accordance with another embodiment of the present invention.

FIG. 10 shows a cross-section of a solar cell 420 having a non-uniform film 423 through which contact holes are to be formed. In the example of FIG. 10, the film 423 comprises an interlayer dielectric. The film 423 may be a single layer dielectric or a multi-layer dielectric stack (e.g., oxides and/or nitrides; oxides and/or polyimide) formed over a solar cell substrate 421. The solar cell substrate 421 may comprise a monocrystalline silicon wafer. The P-type and N-type diffusion regions may be formed in the solar cell substrate 421 or in another layer (e.g., polysilicon) formed on the solar cell substrate 421.

In the example of FIG. 10, portions of the film 423 over the P-type diffusion regions are thicker than portions of the film 423 over the N-type diffusion regions. In other cases, portions of the film 423 over the N-type diffusion regions are thicker than portions of the film 423 over the P-type diffusion regions. This difference in film thicknesses may be due to the process of forming the P-type and N-type diffusion regions, such as in the sequence of forming dopant sources over the diffusion regions. In the example of FIG. 10, forming contact holes through the film 423 to the N-type diffusion regions requires less laser energy compared to forming contact holes through the film 423 to the P-type diffusion regions. Using the same laser energy to form contact holes to the P-type and N-type diffusion regions may thus result in punching through the diffusion regions under the thinner film 423, or other problems. On the other hand, using different laser energies to form contact holes to the P-type and N-type diffusion regions may require multiple laser ablation steps and may result in processing delays not just because of the additional steps, but also in reconfiguring the laser for different energies.

For the solar cell design of FIG. 10, the thickness of the dielectric stack over the P-type diffusion regions may be in the 500-10000 Angstroms range, and the diffusion depth of the P-type diffusion regions may be in the 200-2000 nm range. For a high-efficiency solar cell, i.e., a solar cell with efficiency greater than 20%, the minority carrier lifetime and saturation current density (Jo) would be greater than 1 msec and less than 120 $fA/cm^2$ if there were no laser damage. To avoid ablation all the way through the junction in the base and increase the saturation current density Jo and lower the minority carrier lifetime, while also completely removing the film being ablated, the proper laser condition must be used. Using a wavelength shorter than 540 nm while keeping the absorption depth to a minimum prevents the minority carrier lifetime. Using a laser with a pulse length shorter than 20 ps will keep the thermal ablation depth to less than 2000 nm. The laser energy would then be tuned so that the ablation threshold is achieved (e.g., 1-20 µJ). Complete oxide removal would then result in series resistance of less than 1 ohm-$cm^2$ in the finished solar cell. However, with these film stack thickness conditions on a high-efficiency solar cell, a single laser pulse will still not be able to clear an entire dielectric stack without decreasing minority carrier lifetime or increasing Jo. That is, keeping the minority carrier lifetime greater than 1 msec and Jo to less than 120 $fA/cm^2$ will result in series resistance greater than 1 ohm-$cm^2$, and getting the series resistance less than 1 ohm-$cm^2$ will result in the minority carrier lifetime below 1 msec. This problem may be solved by using 2 or more laser pulses, where the pulse to pulse spacing is separated by less than 500 ns and the amplitude of the subsequent pulses is between 10% and 100% the amplitude of the first pulse. This allows for more material removal without additional decrease in minority carrier lifetime or increase in Jo. An example multi-pulse laser ablation process is described in commonly-owned U.S. application Ser. No. 12/795,526, filed on Jun. 7, 2010, and incorporated herein by reference in its entirety. Other multi-pulse laser ablation processes may also be used.

Because the dielectric stack thicknesses over the P-type and N-type diffusion regions may be different, and thus require different laser energies to achieve the proper lifetime/series resistance balance, the laser ablation tool gets relatively complicated, requiring changes in power for different regions of the solar cell being fabricated. This requires precise spatial coordination between the laser and the beam delivery system to synchronize laser power and location and avoid creating shunts (i.e., electrical shorts) due to a misaligned laser. Misalignment can be avoided by slowing down the beam delivery system. However, doing so would result in lower throughput on the tool, and therefore increase the tool cost for a certain throughput. As a solution, the dielectric stack may be tuned so that the ideal laser parameter, such as energy and number of pulses, on one region does not result in ablation in another region. For example, dielectric stack thickness over the P-type diffusion regions may be made to be 5000-10000 Angstroms, and the dielectric stack thickness over the N-type diffusion regions may be made to be less than 2500 Angstroms. This allows a laser energy of 3 µJ with two pulses to ablate the dielectric stack over the N-type diffusion regions, but not the dielectric stack over the P-type diffusion regions.

Figure 15:
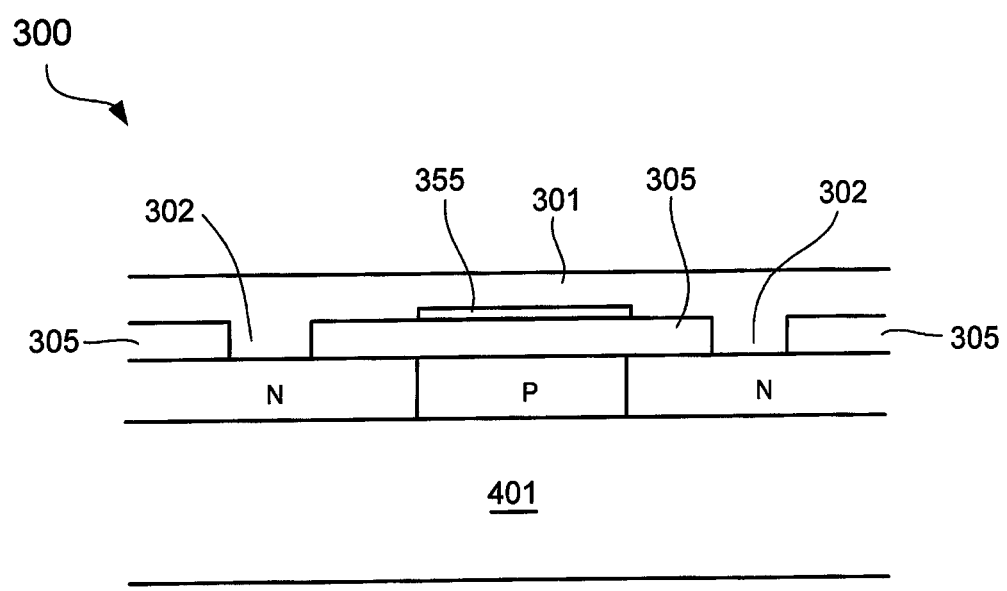
FIG. 15 shows the cross-section of FIG. 3 with an additional dielectric layer in accordance with an embodiment of the present invention.

In any case where laser misalignment may cause a shunt problem as described above (e.g., in FIG. 3, the electrical short 306), the inventors have discovered that an additional dielectric layer may be deposited in a patterned way so that the laser is blocked from causing ablation. FIG. 15 shows the cross-section of FIG. 3 except for the addition of an additional dielectric layer 355 patterned on portions of the interlayer dielectric layer 305 over the P-type diffusion regions. Other components shown in FIG. 15 have been discussed with reference to FIG. 3.

In the example of FIG. 15, the additional dielectric layer 355 may comprise a material that may be ablated sacrificially, such as a pigmented ink. The additional dielectric layer 355 may be thick enough (e.g., greater than 500 Angstroms) to prevent absorption of the laser wavelength used. The additional dielectric layer 355 may also comprise a material that is opaque to the laser wavelength (e.g., polyimide) and thick enough (e.g., greater than 500 Angstroms) to prevent the ablated material underneath from breaking through. The additional dielectric layer 355 may also comprise a semi-transparent material, provided that the combination of direct ablation of the sacrificial layer and ejected material from below does not cause a pinhole to form in the additional dielectric layer 355. It should be noted that this additional dielectric layer 355 may also have properties that prevent dielectric breakdown, as discussed later below.

Figure 11:
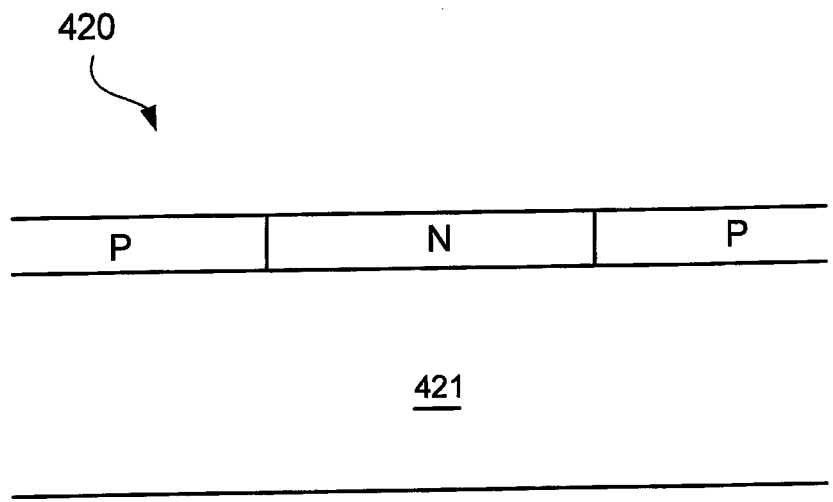
Figure 12:
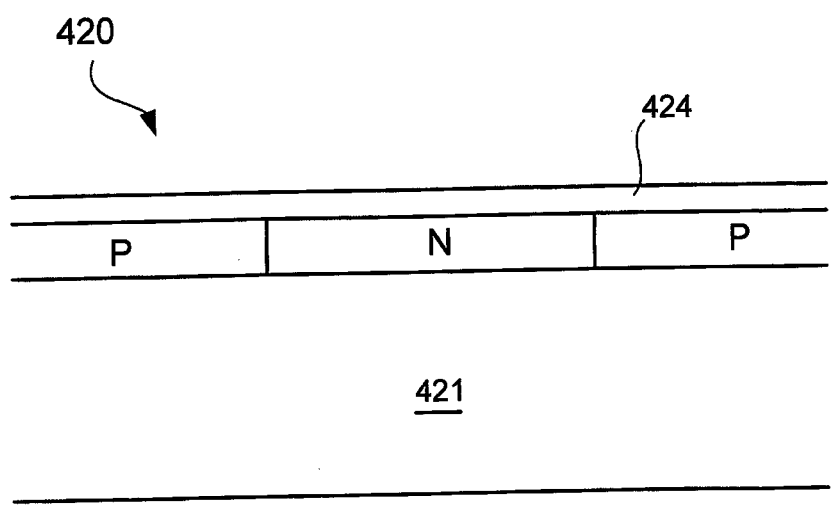
Figure 13:
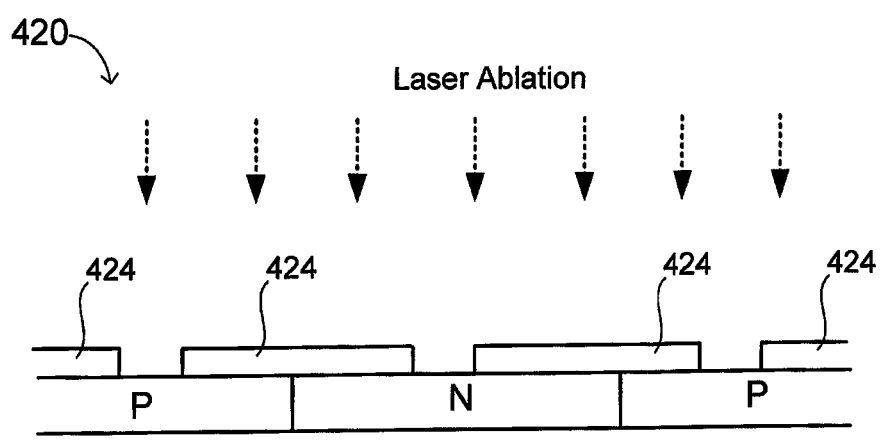

In accordance with an embodiment of the present invention, the solar cell 420 of FIG. 10 is prepared for laser ablation by removing the film 423 and any other material previously formed on the P-type and N-type diffusion regions. This approach is especially advantageous in cases where the dielectric stacks vary from each other by more than 200 Angstroms. This approach is further illustrated in FIG. 11 where all materials on the P-type and N-type diffusion regions have been removed to expose the backside surface of the P-type and N-type diffusion regions. For example, the film 423 of FIG. 10 may be removed using a conventional wet etch process. The film 423 and any other material on the P-type and N-type diffusion regions are removed to control the thickness of the film subsequently formed on the P-type and N-type diffusion regions. Accordingly, in the example of FIG. 12, a substantially uniform film 424 is formed on the P-type and N-type diffusion regions. In essence, the film 424 replaces the non-uniform film 423. The film 424 may comprise an interlayer dielectric (e.g., deposited or thermally grown oxide, followed by silicon nitride) that is deposited with substantially uniform thickness. The film 424 may be deposited by chemical vapor deposition, other deposition, or growth process that allows for uniform film deposition. In FIG. 13, the replacement of the non-uniform film 423 with the uniform film 424 is subsequently followed by a laser ablation step to form contact holes through the film 424 to expose portions of the P-type and N-type diffusion regions. The contact holes allow metal contacts to electrically connect to corresponding diffusion regions. A metal contact to a P-type diffusion region may pass over an N-type diffusion region. Similarly, a metal contact to an N-type diffusion region may pass over a P-type diffusion region. Because the metal contacts are formed in contact holes formed by laser ablation, the chances of a metal contact electrically shorting to an opposite polarity diffusion region is greatly diminished.

Contact holes through the film 423 of FIG. 10 may also be formed by appropriate control of the laser used in the laser ablation step. Typical ablation of dielectric films is through the process of indirect ablation, where the laser energy is absorbed in the substrate, and the film is ejected via the outward force of the ablated substrate. This type of film ablation is known as indirect ablation. For example, when the film of interest does not interact strongly with the laser wavelength, ablation depth and damage in the substrate are driven primarily by pulse length, wavelength, and number of pulses of the laser, all of which need to be reduced for minimal substrate ablation depth. If the film or one of the films in a film stack of interest interacts strongly with the laser wavelength, the laser process parameters will need to be adjusted accordingly, for example, by increasing the number of pulses or by switching the laser wavelength so that direct ablation occurs. Certain types of films may be removed via direct ablation, without ablation in the silicon, by using multiple pulses. An example laser ablation process using multiple laser pulses is described in commonly-owned U.S. application Ser. No. 12/795,526, filed on Jun. 7, 2010, and incorporated herein by reference in its entirety. Other multi-pulse laser ablation processes may also be used without detracting from the merits of the present invention.

A method to modify the optical properties of a dielectric layer (e.g., P-type or N-type doped silicon dioxide) or dielectric stack to suit laser ablation parameters may include tuning refractive index and absorption coefficients of the dielectric through compositional control, or by adding absorbing compounds to the dielectric layer to tune the dielectric layer to get either direct or indirect ablation. As a particular example, refractive indices less than 2.0 for laser wavelengths of 530 nm or longer cause indirect ablation to occur and prevent residual material from remaining on the substrate.

As applied to FIG. 10, a first laser ablation step may be performed to form contact holes through portions of the film 423 over the P-type diffusion regions. The first laser ablation step may be in accordance with a first laser configuration having parameters tailored specifically for the characteristics of the portions of the film 423 over the P-type diffusion regions. A second laser ablation step may be performed to form contact holes through portions of the film 423 over the N-type diffusion regions. The second laser ablation step may be in accordance with a second laser configuration having parameters tailored specifically for the characteristics of the portions of the film 423 over the N-type diffusion regions. The first configuration being different from the second configuration. For example, the first configuration may involve the laser firing multiple laser pulses to drill through portions of the film 423 over the P-type diffusion regions. As another example, the second configuration may involve the laser firing a single laser pulse to drill through portions of the film 423 over the N-type diffusion regions.

Figure 14:
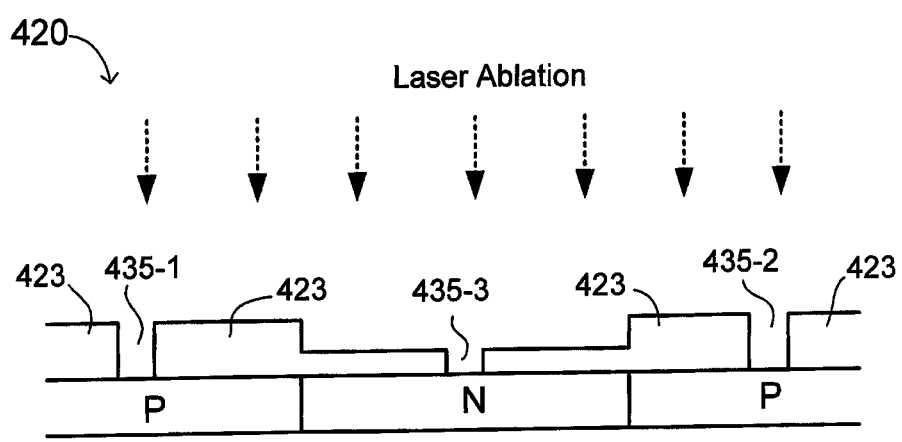
FIG. 14 shows a cross-section of a solar cell with laser-formed contact holes in accordance with another embodiment of the present invention.

The resulting structure is schematically shown in FIG. 14, where the contact holes 435-1 and 435-2 through the film 423 and exposing the P-type diffusion regions are formed by laser ablation with the laser firing in accordance with the first configuration, and the contact hole 435-3 through the film 423 and exposing an N-type diffusion region is formed by laser ablation with the laser firing in accordance with the second configuration. Metal contacts may be formed in the contact holes 435 (i.e., 435-1, 435-2, 435-3). A metal contact may be safely formed over a diffusion region of opposite polarity (e.g., N-polarity metal contact over a P-type diffusion region) because the metal contacts are in contact holes formed by laser ablation.

In another embodiment, where defects in an interlayer dielectric, such as the one described with reference to FIG. 3, may be present, the anti-reflective coating deposited on the backside (e.g., anti-reflective coating 110 of FIGS. 4-6) may be tailored in a way to improve the dielectric integrity of the back stack. For example, the thickness and/or resistivity of the backside anti-reflective coating may be increased by approximately 50-100 Angstroms. As another example, the anti-reflective coating may comprise two layers, such as a layer of amorphous-silicon that is uniformly deposited on top or underneath a silicon nitride layer. Preferably, to save fabrication cost, the layer of amorphous silicon and the silicon nitride layer are formed in-situ (i.e., same loading) in the same process step in the same tool. The use of a two layer anti-reflective coating as described herein advantageously increases not just the thickness of the anti-reflective coating but also its dielectric constant, thereby facilitating laser ablation.

In reverse bias, for example, upwards of 6 volts may be applied across the interlayer dielectric film. Typical plasma-enhanced chemical vapor deposition (PECVD) nitride films having a thickness in the range of about 400 Angstroms would breakdown at this voltage if the voltage were applied locally. A target breakdown field of the dielectric film for such an application can be greater than $1 \times 10^7$ V/cm. The target breakdown field may be achieved by addition of 50-100 Angstrom layer of amorphous silicon to the silicon nitride layer, which could decrease the effective field applied within the stack.

Figure 16:
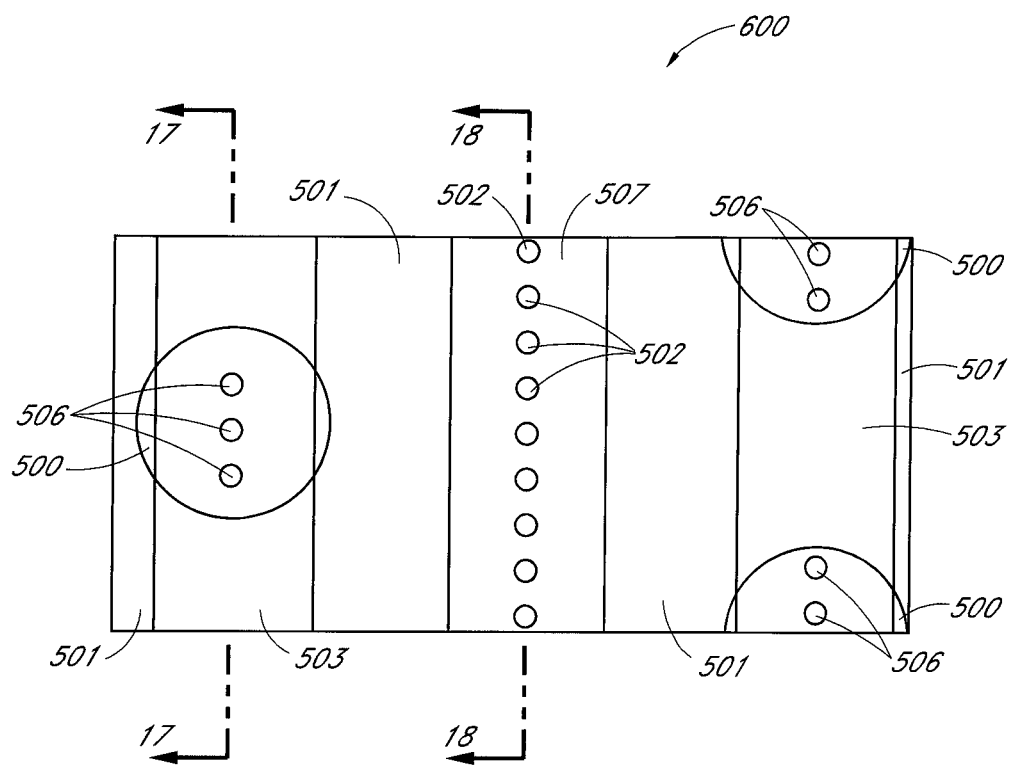
FIG. 16 shows a top view of a portion of a high efficiency solar cell with reduced base diffusion regions in accordance with an embodiment of the present invention.

Referring now to FIG. 16, there is shown a top view of a portion of a high efficiency BCBJ solar cell 600 with reduced base diffusion regions as in the solar cell 100 shown in FIG. 1 in accordance with an embodiment of the present invention. Another example high efficiency BCBJ solar cell with reduced base diffusion regions is described in commonly-assigned U.S. Pat. No. 8,008,575, incorporated herein by reference in its entirety. A base diffusion region is the diffusion region that collects majority charge carriers in the solar cell, while an emitter diffusion region collects minority charge carriers. In the example of FIG. 16, the solar cell 600 has an N-type substrate. Accordingly, in the solar cell 600, the base diffusion regions 500 are N-type and the emitter diffusion regions 501 are P-type. Each N-type diffusion region 500 is surrounded by a continuous P-type diffusion region 501.

The solar cell 600 includes a plurality of N-polarity metal contacts 503 and P-polarity metal contacts 507. The N-polarity metal contacts 503 may be interdigitated with the P-polarity metal contacts 507. A solar ell contact hole through a material (e.g., interlayer dielectric) exposes an underlying diffusion region. In the example of FIG. 16, contact holes 506 expose an N-type diffusion region 500 to allow an N-polarity metal contact 503 to electrically connect to the N-type diffusion region 500. Similarly, contact holes 502 expose a P-type diffusion region 501 to allow a P-polarity metal contact 507 to electrically connect to the P-type diffusion region 501.

The contact holes 506 and 502 are formed through an interlayer dielectric by laser ablation. In one embodiment, the contact holes 506 and 502, and other laser-drilled contact holes described herein, have a diameter of 30 microns, plus or minus 10 microns. That is, in one embodiment, contact holes formed by laser ablation have a diameter of at most 40 microns, and preferably 30 microns. In FIG. 16 and other figures in the present disclosure, only some of the contact holes are labeled to avoid unnecessarily cluttering the figure.

Figure 17:
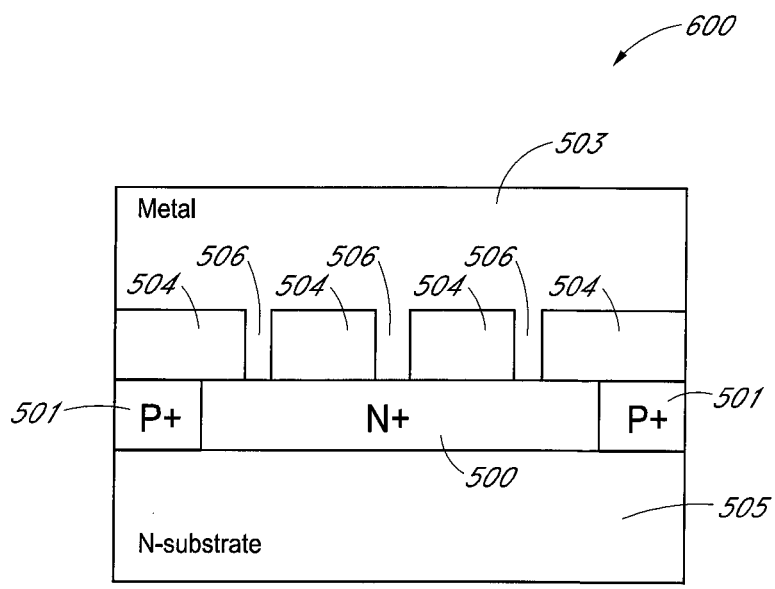
FIGS. 17 and 18 show cross-sections of the solar cell of FIG. 16.
Figure 18:
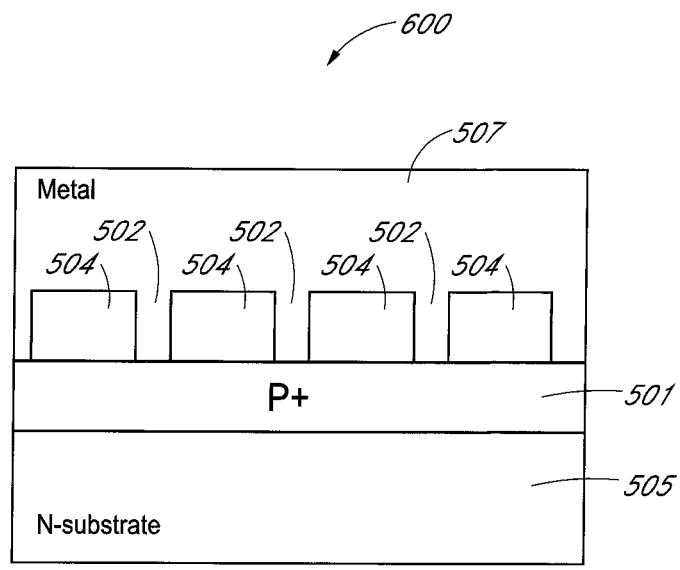

FIGS. 17 and 18 show cross-sections of the solar cell 600 taken at sections 17 and 18, respectively, of FIG. 16. As shown in FIGS. 17 and 18, an interlayer dielectric 504 provides electrical insulation between a metal contact and an underlying diffusion region. In one embodiment, the interlayer dielectric 504 is a stack of dielectric materials and comprises a layer of boro-silicate-glass (BSG) formed on the surface of the diffusion regions, a layer of phosphosilicate glass (PSG) formed on the layer of BSG, and a layer of silicon nitride formed on the layer of PSG. The metal contacts 503 and 507 are formed on the layer of silicon nitride. The interlayer dielectric 504 serves an important function because, in the solar cell 600, an N-polarity metal contact 503 is formed directly over an underlying P-type diffusion region 501 (e.g., see FIG. 17). A defect in the interlayer dielectric 504 may cause an electrical shunt between the N-polarity metal contact 503 and the underlying P-type diffusion region 501.

The laser drilled contact holes 506 and 502 may be formed using a laser ablation system that employs a galvanometer scanner to scan laser pulses on the solar cell. A galvanometer scanner employs a moving mirror for scanning. The movement of the mirror and firing of the laser source are timed such that laser pulses are directed to the locations of the contact holes. In the example of FIG. 16, the contact holes 506 are only formed directly over the N-type diffusion regions 500. Otherwise, an N-polarity metal contact 503 may be electrically shorted to a P-type diffusion region 501. Conventional galvanometer scanning requires momentum change of the mirror to ensure accurate positioning. The galvanometer scanner needs some idle, and thus wasted, time to move the mirror between N-type diffusion regions 500. The momentum change of the galvanometer mirror slows down the laser ablation process, adversely affecting throughput.

Figure 19:
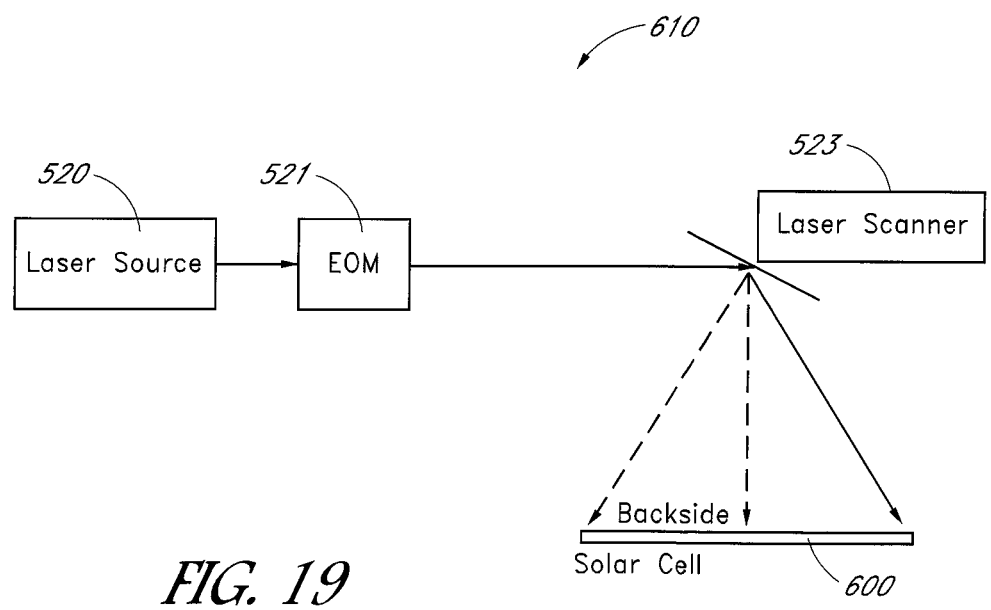
FIG. 19 shows a solar cell laser ablation system in accordance with an embodiment of the present invention.

FIG. 19 schematically shows a solar cell laser ablation system 610 in accordance with an embodiment of the present invention. In the example of FIG. 19, the system 610 includes a laser source 520, an electro-optical modulator (EOM) 521, and a laser scanner 523. Other components not necessary for the understanding of the invention are omitted in the interest of clarity.

The laser source 520 may comprise a commercially available laser source, such as those available from SPI Lasers and Lumera Laser GmbH. The electro-optical modulator 521 may comprise a conventional electro-optical modulator for modulating or gating a laser beam. The electro-optical modulator 521 may be separate from or integrated with the laser source 520. The laser scanner 523 may comprise a galvanometer laser scanner, such as those commercially available from ScanLabs of Germany.

In operation, the laser source 520 fires laser pulses that are scanned by the laser scanner 523 on the backside of the solar cell 600 to form the contact holes 502 and 506. To minimize momentum change of the galvanometer mirror, the laser scanner 523 continuously and uniformly scans the laser pulses in the same direction along a straight line defined by the N-polarity metal contact 503 and the P-polarity metal contact 507. The scanner 523 does not take additional time to reposition unless there is a vector change, such as a move from the bottom of one line to the top of another. The continuous uniform scanning is performed for both contact holes 502 and 506.

The continuous uniform scanning along the same vector does not pose significant issues with the contact holes 502 because there is no risk of shunting a P-polarity metal contact 507 to an N-type diffusion region 500. That is, with respect to the contact holes 502, there is no risk of electrically connecting a metal contact of one polarity to a diffusion region of opposite polarity. However, the same is not true with the contact holes 506 because an N-polarity metal contact 503 passes directly over an underlying P-type diffusion region 501. To prevent inadvertently shunting an N-polarity metal contact 503 to a P-type diffusion region 501, the electro-optical modulator 521 is configured to block the laser from the laser source 520 in jumps between N-type diffusion regions 500. This advantageously prevents formation of contact holes 506 to a P-type diffusion region 501 in areas between N-type diffusion regions 500.

Figure 20:
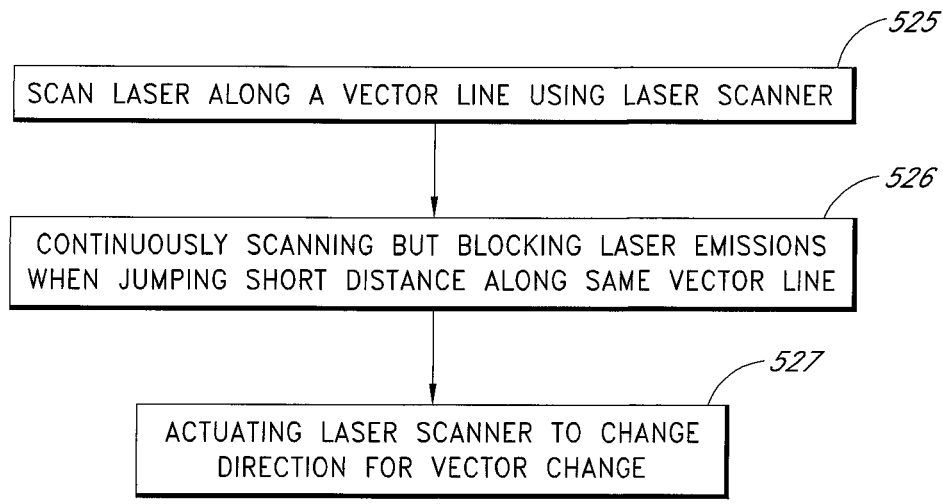
FIG. 20 shows a flow diagram of a method of operating the solar cell laser ablation system of FIG. 19 in accordance with an embodiment of the present invention.

FIG. 20 shows a flow diagram of a method of operating the solar cell laser ablation system 610 in accordance with an embodiment of the present invention. In the example of FIG. 20, laser pulses from the laser source 520 are scanned along a vector line using the laser scanner 523 (step 525). The vector lines define the location of contact holes 506 for the N-type diffusion regions 500 and the location of contact holes 502 for the P-type diffusion regions 501. For a particular vector line, the scanning is continuously and uniformly performed in the same direction by the laser scanner 523 such that the galvanometer mirror maintains the same momentum along the same vector line, but the laser pulses are blocked when jumping a relatively short distance along the same vector line, such between N-type diffusion regions 500 (step 526). By continuous and uniform scanning, the laser scanner 523 positions the galvanometer mirror at the same pitch and direction to form contact holes 506 along the same vector line, but the electro-optical modulator 521 blocks laser pulses that would otherwise form contact holes 506 to P-type diffusion regions 501 between N-type diffusion regions 500. The laser scanner 523 is actuated to change direction for vector changes (step 527). An example of a vector change is when the laser scanner 523 moves from scanning a contact hole 506 on a bottom of one vector line to a contact hole 502 on the top of the next adjacent vector line.

Figure 21:
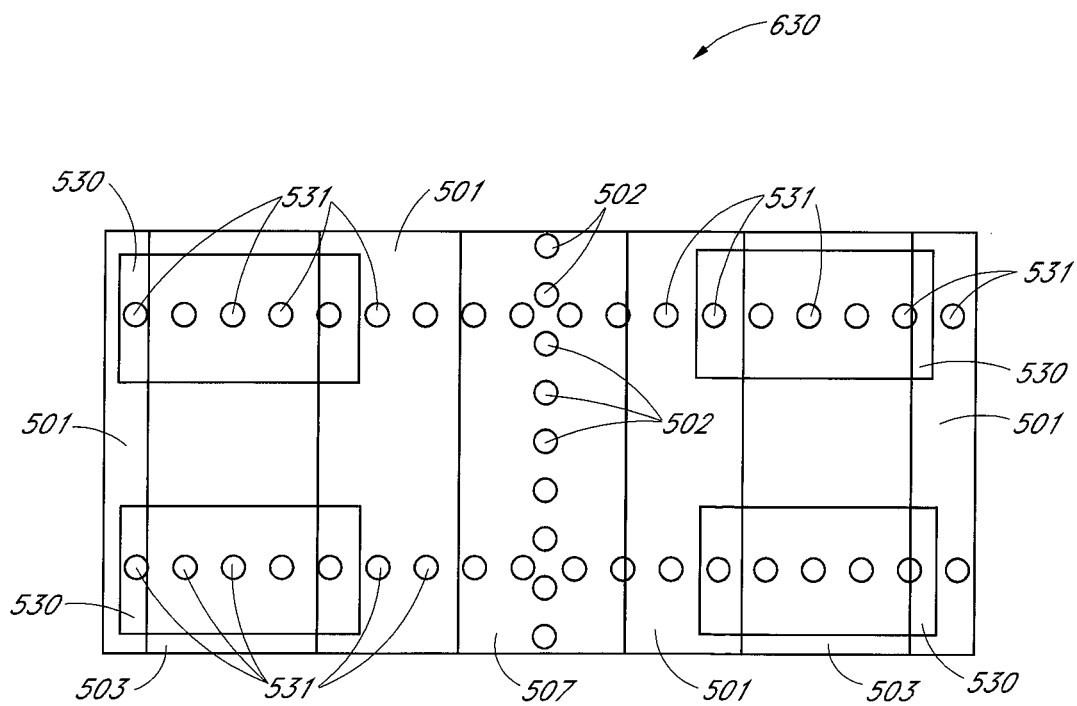
FIG. 21 shows a solar cell with perpendicular scanned contact holes in accordance with an embodiment of the present invention.

Another way of minimizing momentum changes of the galvanometer mirror of the laser scanner 523 when forming contact holes of solar cells with reduced base diffusion regions is to change the configuration of the solar cell such that scanning of contact holes to the base diffusion regions are performed along a vector line perpendicular to the vector line of contact holes to the emitter diffusion regions as in a solar cell 630 of FIG. 21.

FIG. 21 shows the solar cell 630 in accordance with an embodiment of the present invention. The solar cell 630 is the same as the solar cell 600 except for a rectangular reduced N-type base diffusion region 530 and contact holes 531. Each N-type diffusion region 530 is surrounded by a continuous P-type emitter diffusion region 501. As in the solar cell 610, an interlayer dielectric provides electrical insulation between a metal contact and an underlying diffusion region. A P-polarity metal contact 507 electrically connects to an underlying P-type diffusion region 501 by way of contact holes 502 that are laser-drilled through the interlayer dielectric. Similarly, an N-polarity metal contact 503 electrically connects to an underlying N-type diffusion region 530 by way of contact holes 531 that are laser-drilled through the interlayer dielectric. The contact holes 502 may be formed using a laser ablation process with continuously uniform scanning in one direction along a vector line.

In one embodiment, the contact holes 531 are formed using a laser ablation process with continuously uniform scanning in one direction along a vector line that is perpendicular to the vector line of the contact holes 502. That is, the contact holes 531 and 502 are formed along lines that are perpendicular to each other. With regards to the N-type diffusion regions 530, the resulting contact holes 531 are under over portions of an N-polarity metal contact 503 that is not directly over the P-type diffusion region 501. That is, any contact hole 531 that exposes a P-type diffusion region 501 is not under an N-polarity metal contact 503. This advantageously prevents inadvertent shunting of an N-polarity metal contact 503 to a P-type diffusion region 501 while allowing continuously uniform scanning along a relatively straight line to form contact holes to reduced base diffusion regions of a solar cell. An N-type diffusion region 530 may be formed to have a length (i.e., a dimension along the vector line of the contact holes 531) that is longer than the width of an N-polarity metal contact 503. That is, a reduced base diffusion region may extend past both opposing edges of a corresponding metal contact.

Figure 22:
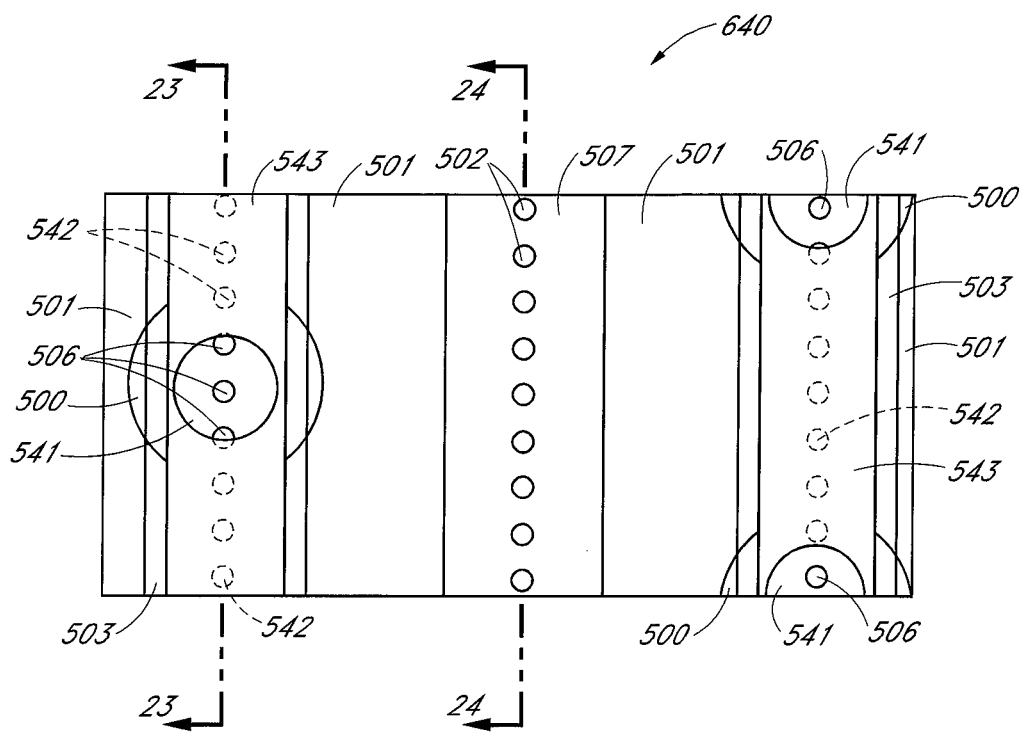
FIG. 22 shows a top view of a portion of a high efficiency solar cell with reduced base diffusion regions and a laser blocking layer in accordance with an embodiment of the present invention.

FIG. 22 shows a top view of a portion of a high efficiency BCBJ solar cell 640 with reduced base diffusion regions in accordance with an embodiment of the present invention. The solar cell 640 is the same the solar cell 600 of FIG. 16, except for the addition of a laser blocking layer 543 between the interlayer dielectric 504 and N-polarity metal contact 503. The components of the solar cell 640 are otherwise the same as explained with reference to FIGS. 16-18.

The laser blocking layer 543 may comprise a dielectric that is resistant to laser pulses so as to prevent laser pulses from penetrating to the interlayer dielectric 504. In one embodiment, the laser blocking layer 543 comprises polyimide. The laser blocking layer 543 advantageously allows a solar cell ablation system to continuously scan and fire laser pulses to the solar cell (i.e., without an electro-optical modulator blocking the laser pulses), while preventing contact hole formation in regions where the contact holes would shunt a metal contact of one polarity to a diffusion region of opposite polarity.

In the example of FIG. 22, the laser blocking layer 543 includes a plurality of openings 541. The openings 541 are not formed by laser ablation. In one embodiment, the openings 541 are formed as part of the masking step. For example, the laser blocking layer 543 may be printed (e.g., by screen printing) to include the openings 541 as part of the printing pattern. Each opening 541 is located directly over a region where contact holes 506 are to be formed by laser ablation to expose an underlying N-type diffusion region 500. Laser pulses that do not fall on an opening 541 are blocked by the laser blocking layer 543. In the example of FIG. 22, regions where laser pulses are blocked are labeled as 542.

Figure 23:
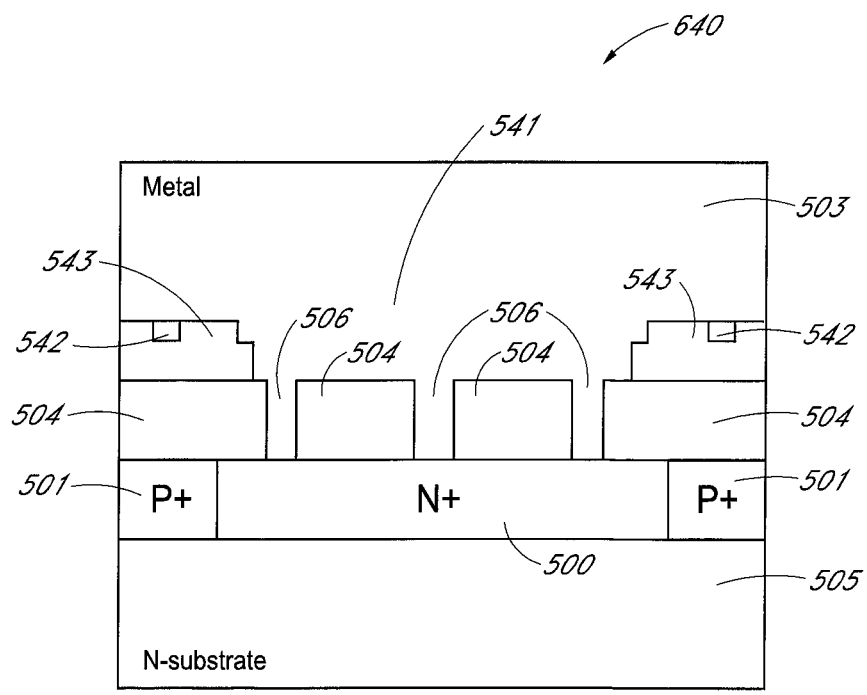
FIGS. 23 and 24 show cross-sections of the solar cell of FIG. 22.
Figure 24:
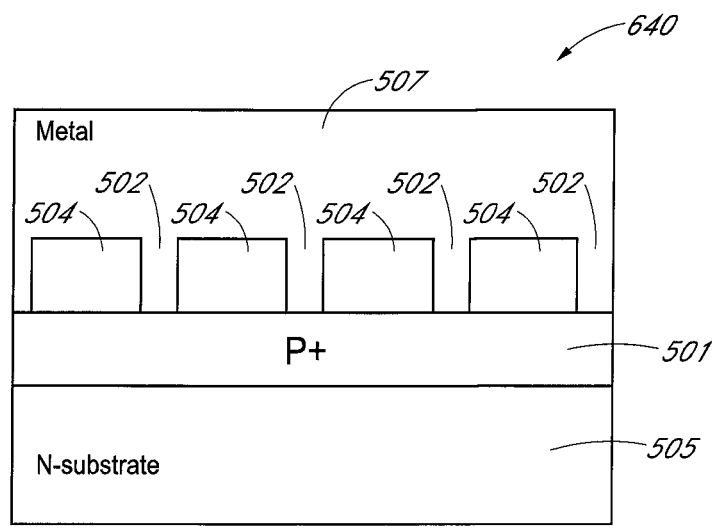

FIGS. 23 and 24 show cross-sections of the solar cell 640 taken at sections 23 and 24, respectively, of FIG. 22. As shown in FIG. 23, the laser blocking layer 543 is located over the interlayer dielectric 504. This allows the laser blocking layer 543 to block laser pulses to regions of the interlayer dielectric 504 that are not exposed by the opening 541. Laser pulses through the opening 541 form contact holes 506 through the interlayer dielectric 504. In the example of FIG. 23, laser pulses blocked by the laser blocking layer 543 are labeled as 542 for illustration purposes. The components of the solar cell 640 are otherwise as previously explained with reference to the solar cell 600.

Figure 25:
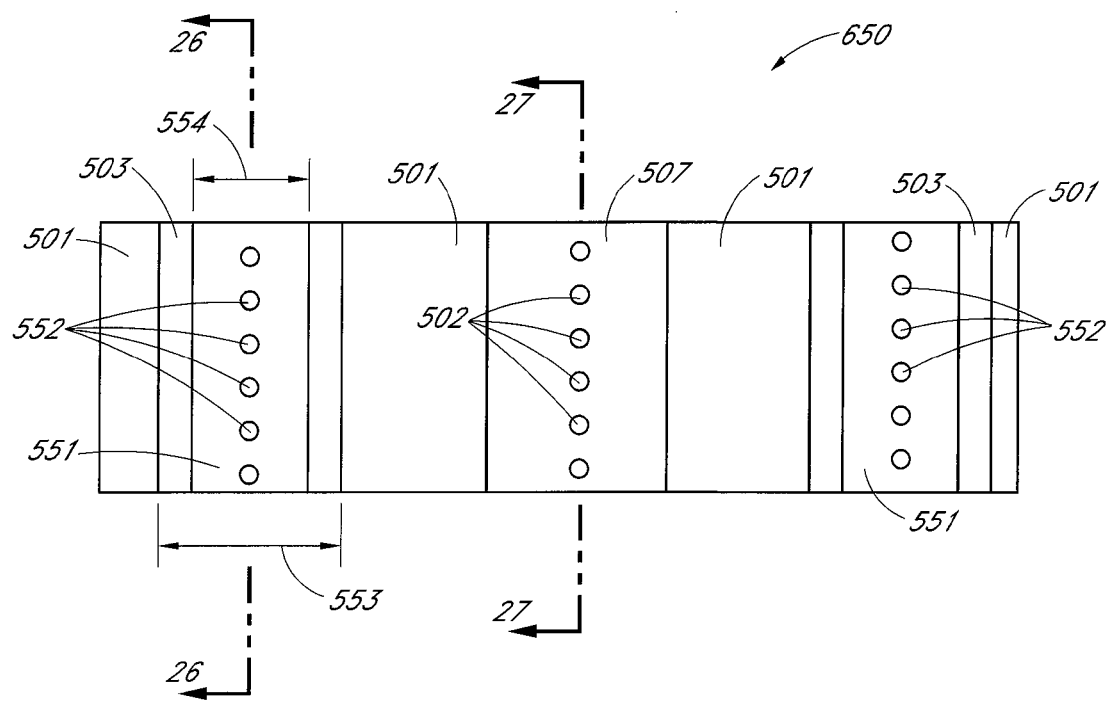
FIG. 25 shows a top view of a portion of a solar cell with laser ablated contact holes and linear base diffusion regions in accordance with an embodiment of the present invention.

FIG. 25 shows a top view of a portion of a solar cell 650 in accordance with an embodiment of the present invention. The solar cell 650 includes linear base and emitter diffusion regions. In the example of FIG. 25, the solar cell 650 has strips of linear N-type base diffusion regions 551 that are alternately formed with strips of linear P-type emitter diffusion regions 501.

The solar cell 650 is the same as the solar cell 600 except that the base diffusion regions (i.e., N-type diffusion regions 551) are linear, rather than dotted. In one embodiment, the linear base diffusion regions are rectangular strips, with corresponding contact holes being arranged in-line along the length of the strips. In the example of FIG. 25, the strips of linear N-type diffusion regions 551 allow for continuous and uniform laser firing to form contact holes 552 along the same vector line to expose underlying N-type diffusion regions 551 without the risk of forming contact holes 552 into a P-type diffusion region 501. This prevents an N-polarity metal contact 503 from inadvertently getting shunted to an underlying P-type diffusion region 501, while still allowing for a high throughput laser ablation process. The P-type diffusion regions 501 are strips of linear emitter diffusion regions as in the solar cell 600.

Figure 26:
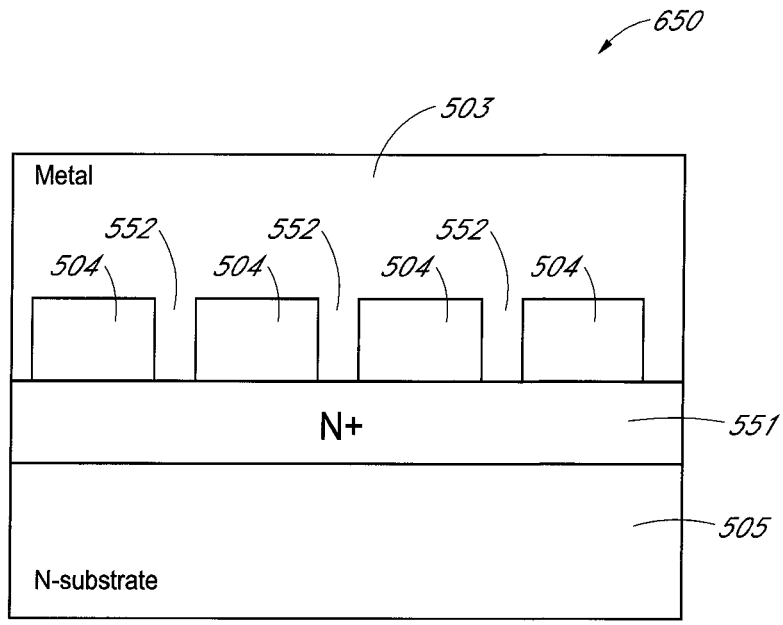
FIGS. 26 and 27 show cross-sections of the solar cell of FIG. 25.
Figure 27:
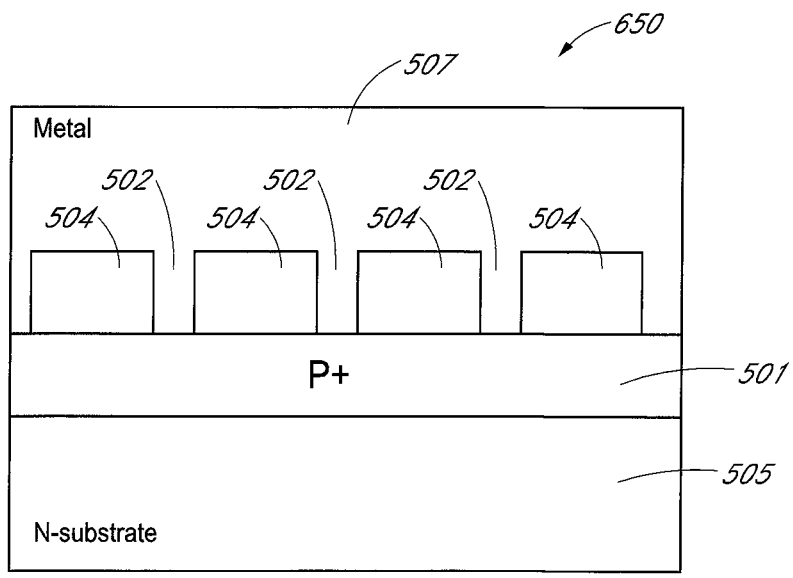

FIGS. 26 and 27 show cross-sections of the solar cell 640 taken at sections 26 and 27, respectively, of FIG. 25. As in the solar cell 600, the contact holes 502 allow a P-polarity metal contact 507 to electrically connect to an underlying P-type diffusion region 501. The contact holes 552 allow an N-polarity metal contact 503 to electrically connect to an underlying N-type diffusion region 551. The interlayer dielectric 504 provides electrical insulation between the metal contacts 503 and 503 and underlying diffusion regions. The contact holes 552 and 502 are formed through the interlayer dielectric 504 by laser ablation. As in the other solar cells described herein, the P-type diffusion regions 501 and N-type diffusion regions 551 may be formed in the N-type substrate 505 or in another layer (e.g., polysilicon) formed on the N-type substrate 505.

Although the solar cell 640 does not have dotted base diffusion regions, the solar cell 640 has high efficiency because a strip of linear base diffusion region may be made narrower than in conventional designs. In the example of FIG. 25, a strip of N-type diffusion region 551 has a width 554 that is narrower than a width 553 of an N-polarity metal contact 503. For example, the N-type diffusion region may have a width 554 of about 260 μm, while an overlying N-polarity metal contact 503 may have a tapered width 553 that is about 280 μm on one end and about 350 μm on the other end. Although this results in some portions of the N-polarity metal contact 503 hanging directly over the P-type diffusion region 501 (i.e., a metal contact of one polarity directly over a diffusion region of opposite polarity), the risk of shunting the N-polarity metal contact 503 to the P-type diffusion region 501 is minimal because the laser ablation process to form the contact holes 552 and 502 preserves the integrity of the interlayer dielectric 504. In one embodiment, an N-polarity metal contact may extend past an edge of a strip of an N-type linear base diffusion region and directly over a P-type emitter diffusion region by as much as 20 μm to 90 μm.

Figure 28:
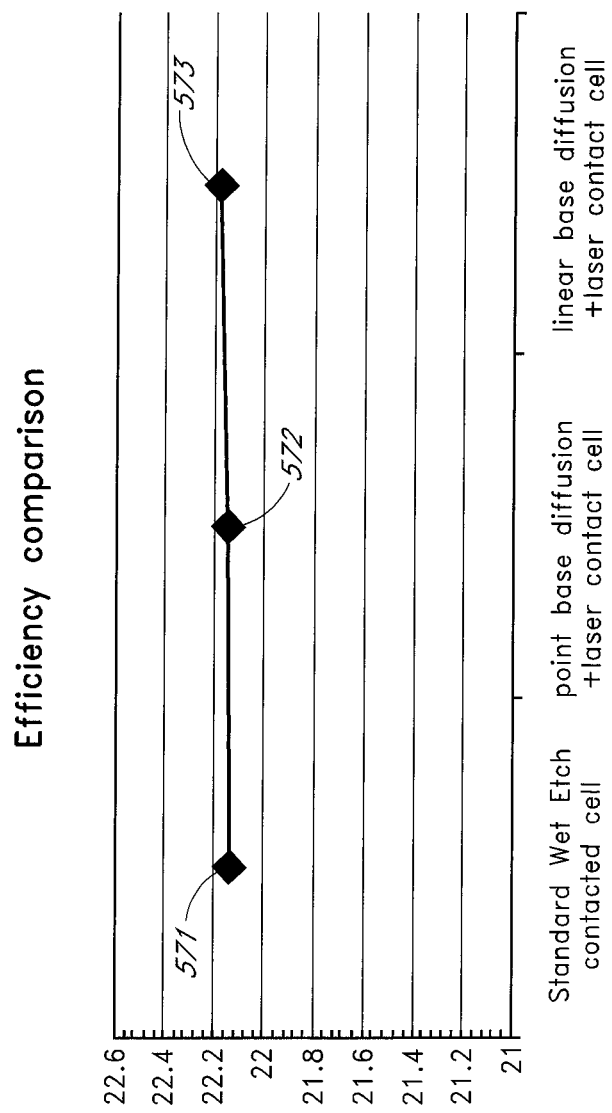
FIG. 28 is a graph showing the summary results of an experiment comparing efficiency of solar cells with wet etched contact holes, with dotted base diffusion regions and laser ablated contact holes, and with linear base diffusion regions and laser ablated contact holes.

FIG. 28 is a graph showing summary results of an experiment comparing efficiency of solar cells with wet etched contact holes (data point 571), solar cells with dotted base diffusion regions and laser ablated contact holes (data point 572), and solar cells with linear base diffusion regions and laser ablated contact holes (data point 573). The experiment yielded an efficiency of 22.13% with standard deviation of 0.073 for solar cells with standard wet etched contact holes, an efficiency of 22.15% and standard deviation of 0.098 for solar cells with dotted base diffusion regions and laser ablated contact holes, and an efficiency of 22.17% with standard deviation of 0.085 for solar cells with linear base diffusion regions and laser ablated contact holes. The efficiencies of the solar cells with laser ablated contact holes are very similar. However, solar cells with linear base diffusion regions have a laser ablation process time of only 3.2 seconds, compared to the laser ablation process time of 20 seconds for solar cells with dotted base diffusion regions. The faster laser ablation process time for solar cells with linear base diffusion regions reflects the advantages afforded by continuous laser scanning along the linear base diffusion regions.

In one embodiment, a hybrid solar cell design includes both linear base and emitter diffusion regions, and dotted base diffusion regions. The hybrid design allows for high throughput laser ablation process to form contact holes on at least the base diffusion regions. The reduced base diffusion regions on other areas of the solar cell maximize charge carrier collection.

Figure 29:
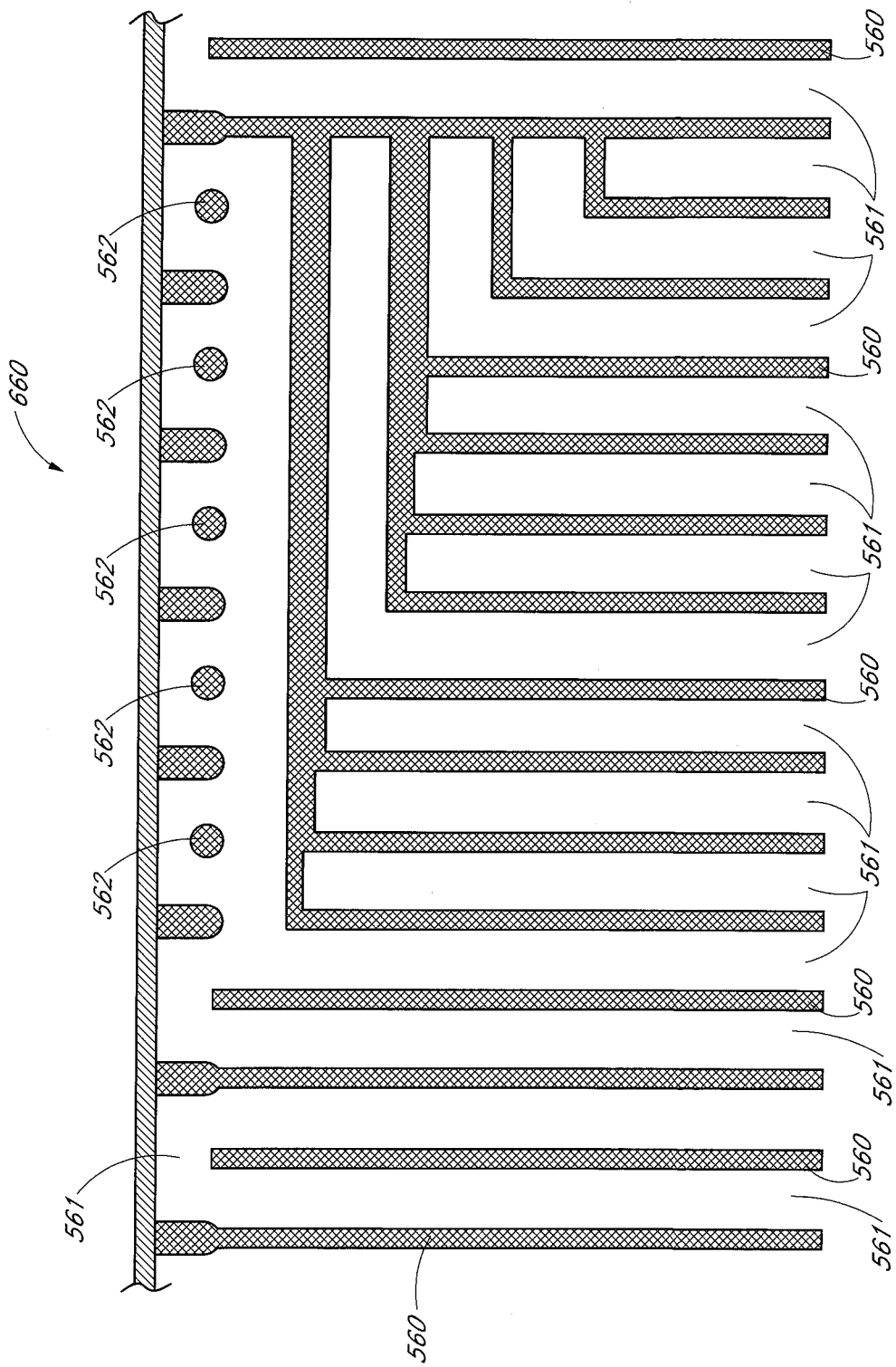
FIG. 29 shows a top view of a solar cell with both linear and dotted base diffusion regions in accordance with an embodiment of the present invention.

FIG. 29 shows a top view of a solar cell 660 in accordance with an embodiment of the present invention. The solar cell 660 has a hybrid design in that the base diffusion regions 560 have a linear design, whereas the base diffusion regions 562 are dotted. In one embodiment where the solar cell 660 has an N-type substrate, the linear base diffusion regions 560 and the dotted base diffusion regions 562 comprise N-type diffusion regions, while the linear emitter diffusion regions 561 are P-type diffusion regions. Contact holes to the base and emitter diffusion regions are formed by laser ablation as previously described.

Improved processes and structures for fabricating solar cells have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A process of fabricating a solar cell, the process comprising:
   forming a plurality of strips of linear base diffusion regions, the plurality of strips of linear base diffusion regions being configured to collect majority charge carriers in the solar cell;
   forming an interlayer dielectric over the plurality of linear base diffusion regions and over a plurality of emitter diffusion regions;
   forming a laser blocking layer over the interlayer dielectric;
   using a laser to form a plurality of contact holes through a single opening in the laser blocking layer and through the interlayer dielectric to expose a strip of linear base diffusion region in the plurality of strips of linear base diffusion regions; and
   forming a metal contact over the strip of linear base diffusion region, the metal contact being electrically coupled to the strip of linear base diffusion region through contact holes in the plurality of contact holes.

2. The process of claim 1 further comprising forming another metal contact over an emitter diffusion region in the plurality of emitter diffusion regions, the other metal contact being electrically coupled to the emitter diffusion region.

3. The process of claim 2 wherein the interlayer dielectric comprises a stack of dielectric layers.

4. The process of claim 3 wherein the interlayer dielectric comprises silicon nitride.

5. The process of claim 1 wherein the laser blocking layer comprises polyimide.

6. The process of claim 1 wherein the single opening in the laser blocking layer is formed by wet etching.

7. The process of claim 1 wherein the metal contact has a width that is wider than a width of the strip of linear base diffusion region.

8. The process of claim 1 wherein the metal contact extends past an edge of the strip of linear base diffusion region and directly over an emitter diffusion region.

9. A solar cell fabricated according to the process of claim 1.

10. A solar cell comprising:
    a strip of linear base diffusion region;
    an interlayer dielectric over the strip of linear base diffusion region;
    a laser blocking layer over the interlayer dielectric;
    a plurality of laser-drilled contact holes through a single opening in the laser blocking layer and through the interlayer dielectric, the plurality of laser-drilled contact holes exposing the strip of linear base diffusion region, each of the plurality of laser-drilled contact holes having a diameter of at most 40 microns; and
    a metal contact electrically coupled to the strip of linear base diffusion region through the plurality of laser-drilled contact holes.

11. The solar cell of claim 10 further comprising:
    a strip of linear emitter diffusion region;
    another metal contact electrically coupled to the strip of linear emitter diffusion region, the other metal contact being electrically coupled to the strip of linear emitter diffusion region through the interlayer dielectric.

12. The solar cell of claim 11 wherein the metal contact is interdigitated with the other metal contact.

13. The solar cell of claim 11 wherein the strip of linear emitter diffusion region, the strip of linear base diffusion region, the metal contact, and the other metal contact are on a backside of the solar cell, the backside being opposite a front side of the solar cell facing the sun during normal operation.

14. A process for fabricating a solar cell, the process comprising:
    forming a linear base diffusion region, the linear base diffusion region being configured to collect majority charge carriers in the solar cell;
    forming an interlayer dielectric over the linear base diffusion region;
    forming a laser blocking layer over the interlayer dielectric;
    using a laser to form a plurality of laser-drilled contact holes through a single opening in the laser blocking layer and through the interlayer dielectric to expose the linear base diffusion region; and
    forming a metal contact over the strip of linear base diffusion region, the metal contact being electrically coupled to the linear base diffusion region through laser-drilled contact holes in the plurality of laser-drilled contact holes.

15. The process of claim 14 further comprising forming another metal contact over an emitter diffusion region, the other metal contact being electrically coupled to the emitter diffusion region.

16. The process of claim 14 wherein the interlayer dielectric comprises a dielectric stack.

17. A solar cell fabricated according to the process of claim 14.

* * * * *